United States Patent [19]

Barna et al.

[11] Patent Number: 4,847,792
[45] Date of Patent: Jul. 11, 1989

[54] PROCESS AND APPARATUS FOR DETECTING ABERRATIONS IN PRODUCTION PROCESS OPERATIONS

[75] Inventors: Gabriel G. Barna; Charles Ratliff, both of Richardson, Tex.

[73] Assignee: Texas Instruments Incorporated, Dallas, Tex.

[21] Appl. No.: 46,497

[22] Filed: May 4, 1987

[51] Int. Cl.⁴ .................. H01L 21/306; C23F 1/02
[52] U.S. Cl. ............................. 364/552; 364/550; 156/626; 156/345
[58] Field of Search .................. 364/550–552, 364/559, 468, 500; 156/345, 626–627; 204/192.33; 219/121 PD; 437/8

[56] References Cited

U.S. PATENT DOCUMENTS

| 3,985,712 | 10/1976 | Garst | 156/626 |
| 4,493,745 | 1/1985 | Chen et al. | 156/345 |
| 4,504,920 | 3/1985 | Mickowski | 364/552 |
| 4,609,426 | 9/1986 | Ogawa et al. | 156/626 |
| 4,611,919 | 9/1986 | Brooks, Jr. et al. | 156/626 |
| 4,615,761 | 10/1986 | Trada et al. | 156/626 |
| 4,675,072 | 6/1987 | Bennett et al. | 156/626 |

OTHER PUBLICATIONS

Khoury; "Real-Time Etch Plasma Monitor System"; IBM Technical Disclosure, vol. 25, No. 11A, Apr. 1983.
Marcoux et al; "Methods of End Point Detection for Plasma Etching"; H. P. Laboratories; Apr. 1981.

Primary Examiner—Parshotam S. Lall
Assistant Examiner—Ellis B. Ramirez
Attorney, Agent, or Firm—Lawrence J. Bassuk; Thomas W. DeMond; Melvin Sharp

[57] ABSTRACT

An apparatus and process for detecting aberrations in production process operations is provided. In one embodiment, operations of a plasma etch reactor (10) are monitored to detect aberrations in etching operations. A reference end-point trace (EPT) is defined (50), regions are defined in the reference EPT (52) and characteristics and tolerances for each region are defined (54). The etcher is run (56) and an actual EPT is obtained from the running of the etcher. The actual EPT is analyzed (58) by comparing characteristics of the regions of the actual EPT with characteristics of corresponding regions of the reference EPT. If the characteristics of the actual EPT exceed those of the reference EPT by predefined tolerances (62) a signal is generated (68). The system also checks for aberrations which are manifested by predefined EPT characteristics and signals when those are detected.

41 Claims, 2 Drawing Sheets

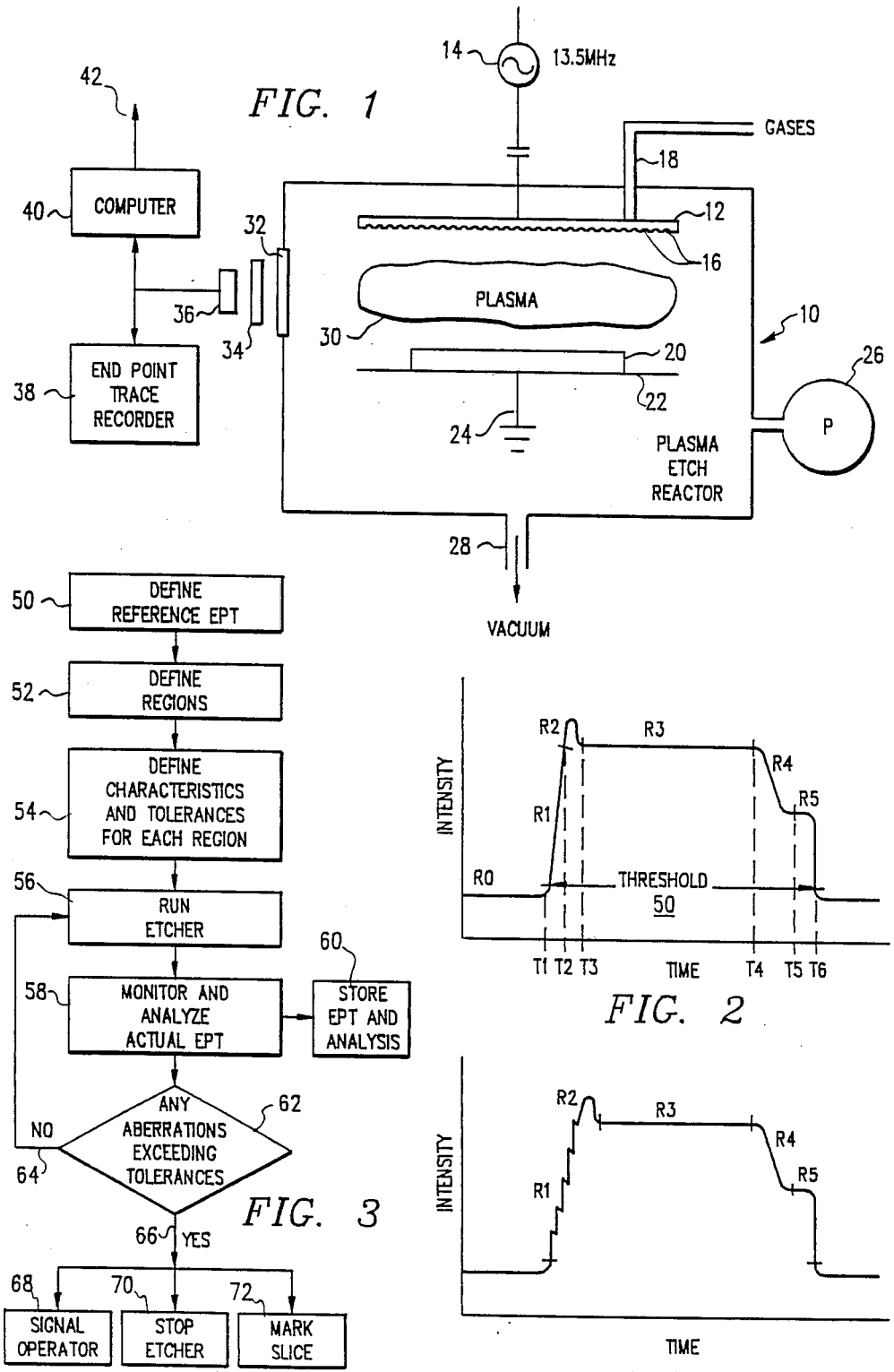

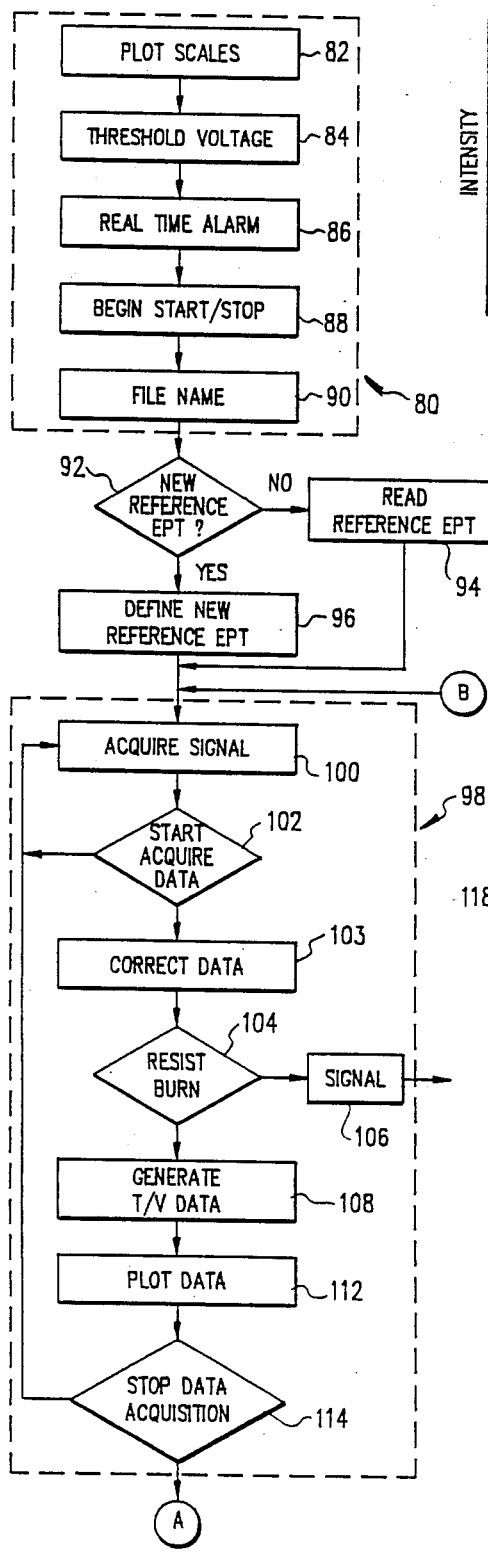
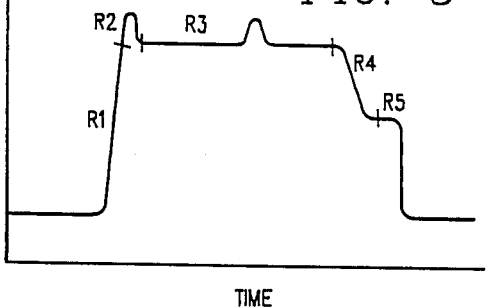
FIG. 5
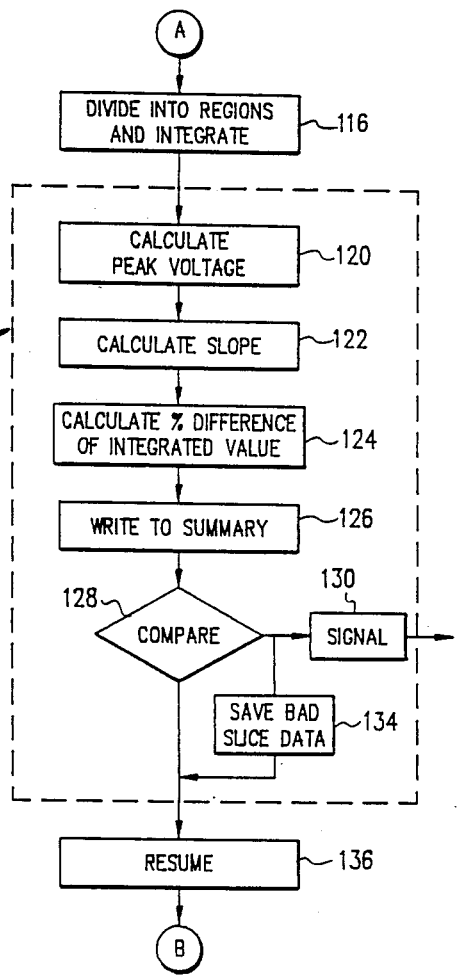
FIG. 6

PROCESS AND APPARATUS FOR DETECTING ABERRATIONS IN PRODUCTION PROCESS OPERATIONS

FIELD OF THE INVENTION

The present invention relates to the field of automated quality control and process operations, and more particularly to a method and apparatus for detecting aberrations in production process operations.

BACKGROUND OF THE INVENTION

The manufacture of semiconductor devices comprises the composite of numerous processing steps on each semiconductor device. A variety of attempts have been made to establish quality control checks on the various processes during the manufacture of the semiconductor devices. The systems for these quality control checks usually include some manner of physically inspecting or testing selected specimens of the semiconductor devices at various stages during the manufacturing processes. However, such systems are often cumbersome, relatively costly, and since they are conducted, in many cases, only on randomly selected devices from the manufacturing processes, cannot guarantee the quality of each of the devices manufactured. Moreover, the systems serve to detect problems in the manufacturing process at points in time after the errors have already been made. As a consequence, the same error may have been repeatedly made during a particular processing operation on a large number of semiconductor devices before the error is detected at a later quality control inspection. It is clearly of economic interest to the manufacturing concern to detect aberrations in the manufacturing processes as early as possible after those aberrations occur. It is even more preferable to be able to detect those aberrations in real time, in other words, at the point in time at which they are occurring. Such instantaneous detection can be used to avoid duplication of the same process aberration to repeated semiconductor devices during manufacture.

A common processing operation in the production of semiconductor devices is a plasma etch. In the plasma etch, a semiconductor device in a form commonly termed a slice is positioned in an etching chamber in the presence of specified gases, at predetermined pressures and temperatures, and an RF power source is applied. In the etch, particular materials on the surface of the semiconductor slice react with gases in the chamber and then volatilize from the surface of the slice. A typical etch process for a slice can proceed for less than one minute up to or over several minutes.

Conventional etch reactors typically include apparatus to monitor particular aspects of the etching process. The reactors include apparatus to provide on-line hardware monitoring, e.g. to monitor the temperature and pressure of the reactor, the wattage of the RF power source, and the flow of feed gases. Prior etching equipment also includes apparatus designed to detect the end-point of the etching operation. *Methods of End-Point Detection for Plasma Etching;* Paul J. Marcoux and Pang Dow Foo, Solid State Technology, April 1981, pp. 115–122, describes several methods proposed for such apparatus. Such proposed methods include methods of emission spectroscopy, optical reflection, mass spectroscopy, impedance monitoring, Langmuir probe monitoring and pressure monitoring. The end-point monitoring apparatus, with whatever monitoring method is used, serves to detect the end of the desired etch reaction so that the etcher can be instructed to terminate its etch cycle and ready itself to etch a fresh slice.

A frequently applied method of end-point detection utilizes an end-point trace (EPT). An EPT is a measure, obtained by emission spectroscopy procedures, of the concentration of gases in the plasma over the surface of the slice being etched. The EPT can be designed to monitor either reactants or products of the etch reaction. By tuning the EPT to measure those gases which are desired etch products, the monitoring apparatus can detect when those products are no longer being emitted into the plasma, thus signaling the end of the desired etch reaction. Typically, the end-point detectors are designed to look for a sharp change in the concentration of the monitored species at a time into the etch process approximately when the end-point is expected. The apparatus is useful in that it provides a signal to the etching equipment to proceed to end the etch cycle, remove the etched semiconductor slice, and insert a fresh semiconductor slice into the etching chamber.

The end-point detectors, whether applied or merely theoretical, however, are subject to several limitations. A principal limitation is that the detectors serve only to detect the end of etching operations. Accordingly, the detectors provide no information as to whether the etch process has proceeded in an optimum fashion or whether aberrations in the process occurred.

A need has arisen for a process or apparatus which can determine whether the etching process is proceeding or has been accomplished in an optimum fashion. Such an etch monitoring system which could automatically check the etch of every slice would also overcome numerous disadvantages referred to above with regard to current semiconductor manufacture quality control systems. Moreover, it would be advantageous if a system could monitor the etch process in such a fashion as to provide information regarding whether layers formed on the semiconductor device prior to the etching operation were formed and treated in the intended manner.

The prior art devices and processes are not able to provide the above mentioned desired advantages.

SUMMARY OF THE INVENTION

The present invention provides a process and apparatus for detecting aberrations in cyclic or repeated process operations. A particular application is in regard to plasma etch processes in the production of semiconductor devices. An embodiment of the present invention makes use of end-point trace data, which forms a continuously variable signal curve between the start and end points of the process, in a manner hitherto unused, to check for aberrations in the etching process. Moreover, it has been discovered that in the practice of the present invention, analysis of the end-point trace data between the start and end points of the process can, in many cases, suggest probable causes of detected aberrations in the etch reaction. In some cases, also, in the present invention, analysis of the process data can provide valuable information regarding the layers of material formed on the semiconductor device prior to the etching process.

In an embodiment of the present invention used in conjunction with a plasma etcher, the actual data collected along the end-point trace (EPT) for the etch of each slice is compared in detail with the data of a predetermined reference EPT to determine not only whether the etch has proceeded as intended, but also to determine whether certain operations prior to etching have been properly carried out on the slice.

In the embodiment of the preceding paragraph, a reference EPT is first defined. The reference EPT is divided into regions, each having significance as to corresponding junctures or steps in the etching process. An actual EPT is obtained during the etching of each semiconductor slice. The system divides the actual EPT into regions corresponding to the regions of the reference EPT. Characteristics of the regions of the actual EPT are compared with characteristics of corresponding regions of the reference EPT. When the characteristics of particular regions of the actual EPT vary beyond predetermined or certain limits from the characteristics of corresponding regions of the reference EPT, a signal specifying such variance is generated.

The comparison of the actual and reference end-point traces can be used to vary the etch process as it is in process or to shut down the etcher and/or to signal an operator so that etching operations can be halted until the cause of the aberration is determined. This advantageously minimizes the number of semiconductor devices which might otherwise be wrongly processed or ruined because of faulty processes.

Moreover, it has been found that comparison of the characteristics of regions of the actual EPT and of regions of the reference EPT can indicate the cause of the misprocessing during the etching operation. This can be of significant advantage, because by suggesting one or several probable causes of the detected aberration, the present invention facilitates the expedited return of the processing equipment to manufacturing operations. This can be particularly significant in applications where the economic cost of downtime of the manufacturing equipment is very high.

Additionally, it has been determined that the comparison of the EPT's can indicate whether particular aberrations or misprocessings have occurred in the manufacture of the slice prior to the etching step. An example of such an aberration is an underbake of a photoresist layer formed and baked prior to the etching operation. Detection of such misprocessing, at least at the time of the etching operation, is extremely advantageous. Discovery of the aberrations at the time of the etch process helps the manufacturer to avoid the expenses of subsequent operations on the aberrational slices where the aberrations diminish the performance of the semiconductor device. It also assists the manufacturer, by suggesting a cause of the aberration, to remedy the cause of the misprocessing upstream of the etcher. This avoids the misprocessing of additional slices.

The present invention advantageously provides sufficient information in many instances to identify which process prior to the etching process has introduced errors into the production of the semiconductor device. Accordingly, significant savings in time and product loss can be attained.

The present invention advantageously provides a system which, by monitoring process observables, for example, the generation of etch reaction species, more closely monitors the actual etching reaction occurring in the etch reactor than in previous systems. Previous systems merely monitor hardware functions of the reactor or when an end point has been reached, and cannot detect a wide range of problems which could occur with the actual etch of the slice during the operation of the reactor.

BRIEF DESCRIPTION OF THE DRAWINGS

The present invention will be described with reference to the accompanying drawings, wherein:

FIG. 1 shows a diagrammatic view of a typical plasma etch reactor including an end-point trace monitoring apparatus and a computer means according to an embodiment of the present invention;

FIG. 2 shows a representation of a reference end-point trace for a particular etch process for an embodiment of the present invention;

FIG. 3 shows an overview flowchart for an embodiment of the present invention;

FIG. 4 shows an example of a representation of an actual end-point trace for a slice etching run with a poorly tuned RF power source at the start of the process;

FIG. 5 is a representation of an actual end-point trace for a slice etch run which has a photoresist burning problem;

FIG. 6 shows a detailed flow diagram of a computer program used in an embodiment of the present invention.

DETAILED DESCRIPTION OF THE INVENTION

As pointed out above, the present invention provides a process and apparatus for detecting aberrations in repetitive-type process operations. The present invention has application with such repetitive process operations which can be monitored by a device to provide a continually variable amplitude electrical signal or signature which correlates to the progress of the process being monitored. One type of such continually variable amplitude electrical signal utilized in the present invention is time based, meaning that it varies over time. Also, the signal can be one of intensity which varies over time. Such signals frequently can be broken down into regions which corresponding to portions or steps of the process being carried out. It is also important that the signal be one for which a preferred or reference signal can be defined, wherein the reference signal represents the signal expected when the process proceeds in the preferred fashion. Accordingly, the actual signal received during operation of the process can be matched against the characteristic signature of the reference signal.

In the present invention, a reference curve is defined which corresponds to the expected appropriate continually variable signal for whatever sensing device is monitoring the process. During the operation of the process, an actual curve is obtained representing the output of the sensing device. Either during the processing cycle or afterwards, the regions of the actual curve are matched against corresponding regions of the reference curve to determine whether the actual curve suggests that the process is proceeding or has proceeded in the preferred fashion or whether the actual curve suggests that aberrations have occurred in the process cycle. The specific characteristics of each region of the actual curve which are compared with those of the reference curve, can vary from region to region and are determined by process and data considerations for the particular process steps to which those regions correspond.

Results of the comparison of actual and reference curves can be used in a variety of ways, including signaling the processing equipment to continue operations, signaling the processing equipment to halt operations, signaling the operator of the processing equipment, storing information for the particular process cycle for later use, signaling process equipment to alter the process, either during the process or in a later process cycle, or analyzing the data to point out a particular aberration or the cause of the aberration detected.

An embodiment of the present invention has found particular application in conjunction with semiconductor manufacturing processes, particularly with plasma etch processes. Described in FIGS. 1 through 6 below is an embodiment of the present invention adapted for application to plasma etching operations.

Shown in FIG. 1 is a diagrammatic view of a typical plasma etch reactor in conjunction with an embodiment of the present invention. The plasma etch reactor includes a plasma etch reactor vessel 10 in which is mounted a shower head electrode 12. The shower head electrode is capacitively coupled to an RF power source 14 which typically provides power at 13.5 megaHertz. The RF power source 14 has an RF tuning network not shown in FIG. 1. The electrode 12 has holes 16 therein from which are emitted gases which are fed to the electrode 12 by way of a gas line 18. The flow of the gases is controlled by a mass flow controller not shown in FIG. 1. A semiconductor slice 20 being etched is mounted on a substrate 22 of the reactor which is grounded as shown at 24. The reactor includes a pressure regulator 26 and a gas exit line 28, which is operatively connected to a vacuum system now shown in FIG. 1.

In the operation of the plasma etch reactor, a mixture of gases is fed through electrode 12 while power is supplied to the electrode from the RF source 14. A low pressure glow discharge is established to produce a reactive species in a plasma 30. The reactive species selectively react with a thin film of materials on the slice 20 to form a product which volatilizes from the slice 20 and is eventually pumped out of the reactor through gas exit line 28. The etching operation is conducted until, in a successful etch, a predetermined amount or depth of the desired material is etched away from the surface of slice 20.

The EPT from the etch reactor which is used in the embodiment present invention shown in FIG. 1, is obtained by methods of emission spectroscopy. The EPT sensing apparatus is able to detect the intensity of light emitted by electronically excited species in the plasma. Although the light emitted by an atom, molecule or free radical in a non-equilibrium plasma is not strictly proportional to the concentration of that species, for purposes of the EPT the proportionality can be assumed to hold. The sensing apparatus can be set to monitor the concentrations of either etch reaction products or reactive species in the plasma. Once a determination is made as to which etch product or species is to be detected, the system is set to monitor the wavelengths of light corresponding to those emitted by the species to be monitored. In the embodiment described herein, the system is designed to detect the light emitted by particular etch products.

Referring again to FIG. 1, there is shown also the apparatus for obtaining the EPT for the process of the etcher. The plasma etch reactor vessel 10 includes a window 32 through which passes light emitted from the plasma. Light from the window passes to an optical filter 34 which blocks light except at preselected emission bands. In the embodiment described, the apparatus is set to monitor carbon monoxide and so filter 34 is selected to pass light in a band at about 520 nanometers. Light emitted from the plasma 30 passes through window 32 and, if of the appropriate wavelength, passes through optical filter 34 to photodiode 36. An electrical signal having an amplitude corresponding to the intensity of light impacting on photodiode 36 is generated by photodiode 36 and is communicated to the EPT recorder 38. In a typical prior art plasma etch reactor, the EPT trace recorder 38 provides a paper strip-chart record of the EPT trace of each etching operation conducted in the reactor.

One of the desired reactions in the embodiment described is the etching of silicon dioxide with CF4:

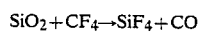

$$SiO_2 + CF_4 \rightarrow SiF_4 + CO$$

The formation of CO, and hence its spectral intensity in the plasma, decreases when all the $SiO_2$ is etched off the slice, and the above reaction ceases to produce more CO. Thus, a decrease in the CO line intensity, at times when this end-point is anticipated, is an indication that the layer has been etched off (i.e. that the end-point has been reached).

Also shown in FIG. 1 is computer means 40 operably connected to photodiode 36 to receive the output signal of photodiode 36. Computer 40 functions in the embodiment of the present invention, among other things, to store programs and subroutines for the system, to store the reference EPT and other data, to compare the reference EPT with the actual EPT, to store information regarding comparisons of the reference EPT with the actual EPT, and provide certain signals or controls to the plasma etcher or the operator of the equipment as well as other functions as desired. An output 42 from computer 40 provides signals to either the plasma etch reactor, control equipment for the plasma etch reactor, to an operator, to signal means or other means as desired. Computer 40 is programmed to conduct the comparisons of EPT's as well as other functions outlined below and may comprise a stand alone computer or may comprise a part of the computer control systems for the plasma etch reactor if such computer control systems have sufficient capability to carry out the functions described below. In one embodiment of the present invention, computer 40 comprised a Texas Instruments personal computer with a Lab Master 12 bit analog/digital conversion board, and software written in BASIC. The software is designed such than an EPT of any shape can be analyzed and compared with a reference EPT for the etching process.

FIG. 2 shows a simulated reference EPT for a particular etch process through one layer of oxide material on a semiconductor slice in an embodiment of the present invention. In FIG. 2, intensity is plotted as a function of time. The intensity corresponds to the intensity or amplitude of the signal generated by photodiode 36 in FIG. 1. As stated previously, the EPT apparatus has been present to monitor carbon monoxide etch reaction products volatilized into the plasma. The EPT of FIG. 2 simulates the amplitude varying with time of a signal from photodiode 36 from a point in time prior to when the etch reaction starts or is initiated, through several steps encountered during the plasma etch, and, finally, through the end of the plasma etch process. Accordingly, then, in FIG. 2, prior to T1 in region RO, the amplitude of the signal from photodiode 36 is below the threshold value 50 indicating the lack of a plasma of excited species. This indicates that the plasma etch reaction has not yet begun. At time T1, the plasma etch reaction starts as the EPT amplitude rises above the threshold level 50. The amplitude of the EPT increases sharply from T1 to T2 in the region denoted R1, thus indicating the presence of a plasma of excited species and a sharp rise in the concentration in the plasma of the monitored species. R1 corresponds to a particular phase of the etching operation, as do each of the other regions R2 through R5 of the EPT. For example, R2 represents a transition point from the start-up phase R1 to the relatively stable phase R3 during which a predetermined amount of oxide material is etched from the surface of the slice and where the concentration of monitored species in the plasma remains approximately constant. Region R4 indicates a drop off in the concentration of the carbon monoxide species being monitored in the plasma, and suggests that the oxide material or layer being etched during R3 has been exhausted. The plateau of R5 corresponds to the outboard signal from the plasma itself with little or no carbon monoxide present in it. Since the amplitude is relatively constant during the plateau region of R5 this indicates that little or no monitored specie is being produced. The etching operation is continued a predetermined period of time after the end-point of the oxide etch as shown in R4 so as to insure a complete clearing of oxide material from areas of the slice being etched. After the predetermined period of time, the etching operation is terminated and the plasma is no longer generated. This is shown in the steep drop off of amplitude in the latter part of R5. At T6 the amplitude of the signal drops below the certain threshold value since no plasma of excited species is present.

It should be noted that the etching operation can also be designed to proceed through two or more layers of different materials. In such cases, the reference EPT, of course, would probably vary from that of FIG. 2 and include regions corresponding to the various layers and materials being etched.

FIG. 3 shows an overview flow chart for an embodiment of the present invention discussed in conjunction with FIG. 1. At the first step of the embodiment shown at 50, a reference EPT is selected and defined. At 52, regions in the reference EPT are defined, at 54 particular characteristics and tolerances for each region are defined as well as the necessary subroutines for calculating and comparing the values of the characteristics. At 56, a slice is processed through the etcher. At 58 the actual EPT is obtained and analyzed by comparing characteristics of the regions of the actual EPT with the characteristics of corresponding regions of the reference EPT. At 60, the actual EPT and the results of the analysis of the actual EPT are stored. At 62, it is determined whether the analysis indicates the existence of any aberrations in the actual EPT and whether those aberrations exceed the tolerances which were predefined. If no aberrations exceed predefined tolerances, then the system returns 64 to the etching operation, and a new slice is etched. If aberrations are detected which exceed predefined tolerances, the system continues 66 to a series of options which comprise signaling the operator 68 stopping the etcher 70, or marking the slice 72, or other options not shown in FIG. 3.

In certain instances the present invention can be used to determine the cause of aberrations or problems detected by the comparison of actual and reference EPT's. Where it is known that a particular problem which may occur manifests itself with a particular EPT chracteristic or set of characteristics, the system can be designed to check specifically for those characteristics. If such particular characteristics are detected, the system can suggest the probable cause of the problem. Examples of two such instances are shown in FIGS. 4 and 5 below. It should be noted, however, that due to the complexity of the interrelationships affecting the etching operations, in some instances, it may not be possible to identify the cause of the problem with absolute certainty. Nonetheless, the present invention, by noting the aberrations and alerting the operator of such, as well as suggesting possible causes, provides significant advantages in the manufacturing process.

FIGS. 4 and 5 show examples of representations of actual EPT's which indicate aberrations from the reference EPT of FIG. 2. FIG. 4 shows a representation of an actual EPT for a slice run with a poorly tuned RF power source at the start of the process. The aberrations in R1 of FIG. 4 can be detected by a sum of squares deviation function comparison of R1 of FIG. 4 with R1 of FIG. 2. Accordingly, a sum of squares deviation would be one of the characteristics of R1 which would be defined, for example, at step 54 of FIG. 3 and later evaluated and compared in the practice of the present invention. Other functions could be used as well to compare R1 of FIG. 4 with R1 of the reference EPT. The anomaly of FIG. 4, when detected, would be attributed by the system to a "poor RF tuning" problem.

FIG. 5 is a representation of an actual EPT for an etch of a slice which exhibits a photoresist burning problem during the etch of region 3. A larger than usual value for the maximum peak height for a specified period of time in region 3 is observed by the system in analyzing this EPT. This problem corresponds to a photoresist burning problem which periodically occurs during an oxide etch. Photoresist burn occurs from time to time in an etcher and is typically caused by misalignment of the slice on the substrate in the etcher. The system detects the problem, assigns the cause to it of a photoresist burn, and notifies the operator accordingly.

It should be noted that a photoresist burn can also occur during the etch for reasons other than slice misalignment. One such reason is if the photoresist was underbaked prior to the etch. A photoresist burn caused by an underbake would also be detected by the present invention. In such a case the present invention serves to detect problems caused by misprocessing of the slice prior to the etch process.

In the same fashion, as illustrated with the EPT's of FIGS. 4 and 5, any feature in an EPT that can be correlated to a unique cause or problem can be watched for with particularity and then, when detected, assigned to its unique cause or problem automatically and a signal identifying such cause or problem generated for the operator.

A wide variety of computer programs can be designed to carry out the present ivnention. Included in this specification preceding the claims, is a copy of a computer program in BASIC used in conjunction with an embodiment of the system shown in FIG. 1. FIG. 6 shows a detailed flow diagram of the computer program used in that embodiment.

Referring to FIG. 6, is shown a detailed flow diagram of a computer program used in one embodiment of the present invention. Shown in the broken line outline of functional block 80 is the step of setting up the parameters for the particular EPT analysis to be conducted. The step of setting up the parameters 80 comprises several steps as shown, including setting up the plot scales and interrupts 82, defining the threshold voltage 84, setting the real-time alarm parameters 86, setting the start/stop times for the various regions 88 and setting the file name 90. On completion of the first step of setting up the parameters 80, the program proceeds to a decision point 92 where it is asked whether it is desired to define a new reference EPT. If the answer is no, the program proceeds to 94 and a reference EPT is read from memory. If the response to the question at 92 is yes, the program proceeds to 96 where a new reference EPT is defined. At the conclusion of either seps 94 or 96, the program proceeds to functional block 98 which corresponds to those functions wherein the program acquires the actual EPT from the etch reactor and massages the data associated therewith. At 100, the program acquires the analog signal from the photodiode which has been converted to a digital data format by the analog/digital conversion board of the computer 40 of FIG. 1. The digital data is acquired as an amplitude reading at about every 80 milliseconds. At 102, the program starts its analysis when the voltage reading of the actual EPT is greater than the threshold voltage. At the point in time when the voltage reading increases beyond the threshold voltage, the time is set at zero for the analysis. At 103, the program smooths the data acquired to generate one amplitude reading per second. At 104, the program checks the incoming data for indication of photoresist burn. If a photoresist burn is detected, a signal indicating the photoresist burn is generated and communicated 106 to outside equipment. If no photoresist burn is detected, the program continues by generating time/voltage data 108. At 112, the corrected data is plotted on the screen next to the reference EPT. At 114, the program stops its data acquisition when the voltage reading acquired drops below the threshold voltage.

In the next step 116, the program divides the data it has acquired into regions corresponding to the regions of the reference EPT. At 116 it also integrates the time and voltage data it has acquired for each of the regions. The program determines the beginning and ending time of each region of the actual EPT based on preset start and stop times for each region. The start and stop times are predefined for each EPT at step 88 of FIG. 6. Also, the time for each actual EPT was set at zero, as shown at step 102, when the EPT voltage increased above the threshold voltage.

In functional block 118, the program calculates the predefined function values for each region. At 120, the peak voltage is calculated for each region. At 122, the slope at the mid point of straight line segments of each region is calculated. At 124, the percent of difference in the integrated values for each region of the actual EPT compared to the corresponding region of the reference EPT is calculated. At step 126, the values calculated at each of steps 120, 122 and 124 are written to a summary file.

At 128, the function values calculated for each region are written to the summary file and are compared with the predefined function values and tolerance limtis for corresponding regions of the reference EPT. If the calculated function values for any region of the actual EPT vary beyond the predefined limits for each function for that region, a signal is generated by the system 130 and communicated to outside equipment.

At 134, the program saves the raw data for all bad slices in a data file. At 136, the program resumes looking at the analog/digital signal from the etch reactor according to steps 98 and 100.

The embodiment of the present invention described herein has proven to be effective in monitoring slice etching in semiconductor manufacturing operations. Moreover, it has proven effective in monitoring for particular problems such as photoresist burn of the slice during etching or a poor RF-tuning problem.

The present invention has particular advantages when used with a plasma etch reactor. Many of these advantages stem from the complexity of the operation of the plasma etch reactor. This complexity arises from the numerous factors which affect whether the etching operation proceeds in an optimum fashion. Since the factors which affect the actual etching reaction are so numerous, the present invention which looks directly to characteristics of the reaction itself rather than operating parameters of the reactor vessel, provides a more reliable and direct means of monitoring the etch process than has heretofore been proposed. Restating the point, the embodiment of the present invention monitors process observables in contrast to process control parameters. An example of the process control parameters which can be varied in the plasma etch reactor, include varying the power, the pressure, the identity of as well as relative concentrations of the gases input to the system, the total gas flow into the reactor, and the pressure and temperature of the reactor. Some of these process control parameters are typically monitored by the hardware controls of the etch reactor.

However, numerous additional factors beyond the control parameters affect the processes inside the etch reactor. Some of these include what is referred to as chamber seasoning or the character of materials on the inside surfaces of the reactor vessel. Surface material recombinations on the interior surface of the chamber can frequently occur in an etch reactor and serve to significantly affect the progress of the etching reaction within the chamber. Another factor is the distance of the electrode from the surface of the slice. The electrode 12 itself is also etched slightly in the operation of the reactor. After a number of etches, the distance between the surface of the slice and the electrode is increased by the etching of the electrode, and the etch reaction is consequently affected. These factors beyond the control parameters are not readily susceptible to monitoring.

Slight variations in any one or more of the above described factors can have significant impact on whether the etching reaction proceeds in an optimum or acceptable fashion. However, due to the complexity of the interrelations of the various factors it is often difficult to predict the impact of variations in one or more of the factors on the actual etch reaction itself. In light of this complexity the present invention provides particular advantages. The prior art hardware controls on the etcher monitor only a few of the factors affecting the reaction and as pointed out above, many of the factors are not readily susceptible to monitoring. Additionally, the hardware controls only monitor factors affecting the reaction and not the reaction itself. Accordingly, in many cases, if some factor changed and detrimentally affected the etch reaction, but the hardware monitors showed a correct set of process control parameters existing (e.g., correct pressure, temperature, gas flows), the hardware monitors would not detect that the etch reaction was proceeding incorrectly. However, the present invention, by monitoring process observables (e.g., rate of production of reaction product species) much more closely monitors the actual etch reaction and is significantly more likely to detect misprocessing when it occurs than are prior systems.

An embodiment of the present invention provides the advantage of detecting process related problems that arise during a typical plasma etching process, by an examination and analysis of the data forming the end-point trace (EPT) of the plasma etch process. The early and automatic detection of such problems, can significantly and advantageously impact slice yield by preventing further misprocessing of subsequent slices. Additionally, the invention can advantageously attribute the problems detected to predefined causes and generate a signal identifying such causes.

Additional advantages of the present invention include elimination of strip-chart recorders from the clean room, and the ability to edit large volumes of end-point traces by saving only those that show an anomalous behavior.

Another advantage is that the system functions as a process monitoring tool that complements the microprocessor based hardware monitoring function. While hardware monitor sets alarms and halts the processing based on hardware problems (for example, no RF power, no gas flow, incorrect pressure or other similar problems), the embodiment of the present invention can warn the operator, and eventually shut off the etcher, based on reaction process related problems.

The present invention advantageously provides a system which, by focusing on etch reaction observables, can detect errors in the etching operation which cannot be detected by monitoring equipment which simply monitors the hardware functions, i.e. gas flows, temperatures, or RF power settings of the etcher. Moreover, the present invention advantageously provides a system which comprises a backup monitoring system to the hardware monitoring apparatus of matching reactor. Accordingly, if hardware monitoring sensor should fail and the hardware function proceed out of specification, the present invention would detect the problem as soon as the non-spec hardware function caused the etch reaction to vary from the reference reaction.

The present invention can be advantageously applied in numerous circumstances. For example, it can be applied in various etching operations, each of which has its own signature or reference EPT. Each of these various EPT's may have different number of regions, with each of the regions being of different shapes. Moreover, various characteristics of each region can be defined and functions for detecting or measuring such characteristics also defined, in light of consideration unique to the particular etch or region of the etch. Additionally, the present invention can be advantageously applied on processes beyond plasma etch reactions.

Although the embodiment of FIG. 1 received an analog original from the photodiode signal generator, it will be understood that the present invention has application with either analog or digital type signals.

Provided below is a printout of an embodiment of a software program applied to the system of FIG. 1 and as illustrated in the flow chart of FIG. 6.

```
10  '
20  '
30  '
40  '
50  '
60  '
70  ' ********************DESCRIPTION****************************************
80  ' This program is intended to monitor, display and analyse the end-point
90  'signal from a plasma etcher. It performs the following functions:
100 ' 1. Digitizes analog voltage from EP detector, at roughly 1 sec. intervals
110 ' 2. Massages the data to get 1 point only, every second
120 ' 3. Displays the currently generated EP trace, along with a reference curve
130 ' 4. Data treatment to integrate up to each point
140 ' 5. Stores original data points and integral values in a sequential file
150 ' 6. Generates reference and summary files (.REF & .SUM) for each set of dat
a files.
160 ' 7. Provides on-line monitoring for PR burning, with visual/audio alarms
170 ' 8. Stores only the BAD/BURNT slice data
180 '***********************************************************************
190 DIM ETCHTIME(250),VOLT(250), INTEGRAL(250),REFVOLT(250),REFINTEGRAL(250),DEL
TAVOLT(250),DELTAINTEGRAL(250),FINTEG(250),BADSLICE(300)
200 '***************READ DATA FROM 'REFCURVE'********************************
210 ' SET UP PLOT PARAMETERS
220 ' X-RANGE IS 60-660, Y-RANGE IS 260-10
230 XSTART=60 : XRANGE=600
240 YSTART= 260 :YRANGE=250
250 TIMERANGE=220 'RANGE OF TIME ON X-AXIS, IN SECONDS
260 XSTEP=XRANGE/TIMERANGE :XTRASTEP=0  'FOR MISSED DATA POINT AT A SEC. INTERV
AL
270 PLOTRANGE=1.5  'FULL SCALE VOLTAGE, FOR PLOTTING ON SCREEN
280 YSCALE=YRANGE/PLOTRANGE
290 THRESHOLD=.05     'VOLTAGE FOR START/STOP OF DATA ACQUISITION
300 ' SET UP LIMIT PARAMETERS FOR ALARM
310 LOPEAKLIM=.08 : HIPEAKLIM=3! : INTEGRLLIM=15
320 'SET UP REAL-TIME WARNING SYSTEM FOR PROBLEMS DURING THE ETCH CYCLE
330 CHECKER=1
340 CHECKSTART=40 : CHECKSTOP=120    'TIME LIMITS FOR ON-LINE CHECKING
350 BURNVOLT=.05       'MEANVOLTAGE(@CHECKSTART) + BURNVOLT = ALARM LIMIT VOLTAGE
```

```
360 KEY OFF
370 KEY 7,"SUSPND" : KEY 8, "RESUME" : KEY 9,"STOP"  : KEY ON
380 KEY 6, "              " : KEY 10, "           "
390 CLS
400 ON KEY(7) GOSUB 2530    'STOP LOOKING FOR INPUT
410 ON KEY(8) GOSUB 2570    'RETURN   LOOKING FOR INPUT
420 ON KEY(9) GOSUB 2600    'STOP F   RDING
430 KEY(7) ON : KEY(8) ON : KEY(9)
440 ' DEFINE TIMES AT END OF DIFFE   T REGIONS IN THE TIME-DOMAIN
450 REGION(1)=25: REGION(2)=200   '  GION(3)=30 :REGION(4)=40 :REGION(5)=50
460 STARTTIME(1)=0 : STOPTIME(1)=REGION(1)
470 STARTTIME(2)=REGION(1) : STOPTIME(2)=REGION(2)
480 'STARTTIME(3)=REGION(2)+2 : STOPTIME(3)=REGION(3)-2
490 'STARTTIME(4)=REGION(3)+1 :   STOPTIME(4)=REGION(4)-1
500 'STARTTIME(5)=REGION(4)+2 : STOPTIME(5)=REGION(5)-1
510 INPUT "DATA FILE NAME(max. 5 characters, will be appended by #): ";DFILE$
520 INPUT "STARTING DATA FILE NUMBER? ";CURVE      'COUNTER FOR DATA FILES
530 'OPEN FILE FOR STORING THE CALCULATED CURVE PARAMETERS, FOR EACH SLICE
540 SFILE$=DFILE$+".SUM"       'SUMMARY FILES FOR EACH SET OF DATA FILES
550 OPEN  "A", #2, SFILE$      ' APPEND THE SUMMARY FILE.
560 INPUT "GENERATE NEW REFERENCE CURVE? <Y/N> ";A$
570 IF A$="Y" OR A$="y" THEN NEWREF=1 ELSE NEWREF=0
580 INPUT "HAVE THE REGIONS BEEN DEFINED, WITHIN THE PROGRAM, IN THE TIME DOMAIN
?  HAVE THE ALARM LIMITS BEEN SET? <Y/N> "; Q$
590 IF Q$="Y" OR Q$="y" THEN 620
600 PRINT "DEFINE TIME DOMAINS AND PICK EVALUATIONS IN EACH REGION"
610 PRINT "HAVE TO GET INTO THE PROGRAM" : END
620 IF NEWREF=1 THEN 730
630 OPEN "I",#1,DFILE$+".REF"
640 INPUT #1,DAT$, REFSTART$
650 I=0
660 'PRINT "REFERENCE CURVE TAKEN ON: ";DAT$; " STARTED AT: ";REFSTART$
670 IF EOF(1) THEN CLOSE #1 : REFPOINTS=I-1 : GOTO 730
680 INPUT #1, VOLT,INTEGRAL
690 REFVOLT(I)=VOLT : REFINTEGRAL(I)=INTEGRAL
700 'PRINT I,REFVOLT(I),REFINTEGRAL(I)
710 I=I+1
720 GOTO 670
730 '****************ADC OF EP SIGNAL****************************************
740 ADDRESS=1808 : CHANNEL=15 : GOTO 770
750 INPUT "Address of board in decimal: ";ADDRESS
760 INPUT "Number of input channel to convert: ";CHANNEL
770 ' PLOT AXIS AND REFERENCE CURVE
780 GOSUB 2670
790 ' Continuous A-D conversion of specified channel.
800 REM Disable auto-incrementing, external start conversions and all interrupts
, Gain=1
810 OUT ADDRESS+4,128
820 REM Output channel number
830 OUT ADDRESS+5,CHANNEL
840 REM Start a conversion
850 ' SET UP COUNTER FOR # READINGS BEFORE DATA IS OUTPUT. AVARAGE READINGS.
860 COUNT=1 : LIMIT =12  : VSUM = 0 'when LIMIT=LO then we get 2 voltage reading
s/sec.; when LIMIT=HI then sometimes it misses getting a voltage at each sec. Bo
th these cases are automatically corrected for. SUGGESTION, run with LIMIT=12, b
ut ADJUST as mo
870 OUT ADDRESS+6,0
880 'WAIT UNTIL BIT 7 OF STATUS BYTE IS 1, SIGNALING END OF CONVERSION
890 IF INP(ADDRESS+4) < 128 THEN 890
900 ' READ IN THE DATA
910 LOW = INP(ADDRESS+5)
920 HIGH = INP(ADDRESS+6)
930 ' CONVERT FROM TWOS COMPLEMENTS TO A NUMBER BETWEEN +/-2.5 V
940 X =HIGH*256 + LOW
950 IF X>32767 THEN X=X-65536!      'ONLY IF RANGE IS +/- 2.5V
960 VOLTAGE = X*.00493 + .0197      '5.0V/4096 BITS * GAIN=4
970 'PRINT LOW, HIGH, VOLTAGE
980 VSUM = VSUM + VOLTAGE
990 MEANVOLTAGE= VSUM/COUNT
1000 IF COUNT=LIMIT THEN 1020
1010 COUNT = COUNT +1 : GOTO 870
1020 'GET TIME, AND CONVERT TO NUMERIC VALUE IN SECONDS AFTER MIDNIGHT
1030 T$=TIME$
```

```
1040 HR=VAL(LEFT$(T$,2)): MIN=VAL(MID$(T$,4,2)): SEC=VAL(RIGHT$(T$,2))
1050 T= 3600*HR + 60*MIN + SEC
1060 ' DETERMINE WHETHER ETCH HAS STARTED
1070 IF MEANVOLTAGE < THRESHOLD THEN ETCHTIME=-1 :GOTO 1110
1080 IF ETCHTIME=-1 THEN STARTTIME=T : TRACE=1 : PT=0 : STARTTIME$=T$
1090 ETCHTIME=T-STARTTIME
1100 IF ETCHTIME > 0 THEN ETCHSTOP=ETCHTIME   'DETERMINE LENGHT OF ETCH TO DISTIN
GUISH ETCH FROM ASH
1110 LOCATE 1,1
1120 PRINT T$,ETCHTIME;"   SLICE # ";CURVE;
1130 PRINT "   Voltage = "; : PRINT USING "##.###";MEANVOLTAGE
1140 ' Check for specific problems during the etch
1150 IF CHECKER=1 AND ALARM=0 THEN 1160 ELSE 1200
1160 IF ETCHTIME = CHECKSTART THEN CHECKVOLT = MEANVOLTAGE + BURNVOLT :GOTO 1200
1170 IF ETCHTIME > CHECKSTOP THEN 1200
1180 IF ETCHTIME > CHECKSTART AND MEANVOLTAGE > CHECKVOLT THEN SLICEBURN=SLICEBU
RN +1
1190 IF SLICEBURN>3 THEN BADFLAG=2 : BADSLICE(K)=CURVE :GOSUB 2850 'BURNT SLICE
FLAG
1200 IF K=0 THEN 1260   'PRINT SLICE NUMBERS OF BAD SLICES ONLY
1210 LOCATE 2,1 : PRINT "BAD SLICES: ";
1220 FOR I=0 TO K
1230 PRINT BADSLICE(I);" ";
1240 NEXT I
1250 PRINT ""
1260 ' DATA TO MEMORY WHILE ETCH IS IN PROCESS
1270 IF ETCHTIME=-1 THEN 1430
1280 ' CORRECT POINTS FOR 1 READING/SEC. DURING DATA ACQUISITION
1290 IF PT=0 THEN 1370
1300 IF ETCHTIME-ETCHTIME(PT-1)=1 THEN 1370 ' ALREADY AT 1 SEC. INTERVAL
1310 IF ETCHTIME=ETCHTIME(PT-1) THEN 1320 ELSE 1330   'TWO VALUES AT SAME TIME
1320 VOLT(PT-1) =(VOLT(PT-1)+MEANVOLTAGE)/2 : GOTO 1430
1330 IF ETCHTIME-ETCHTIME(PT-1)=2 THEN 1340   'MISSED VALUE AT 1 SEC.
1340 VOLT(PT)=(VOLT(PT-1)+MEANVOLTAGE)/2 : ETCHTIME(PT)=ETCHTIME-1
1350 PT=PT+1 : XFACTOR=XSTEP : GOTO 1370
1360 PRINT "TIME CORRECTION (1 VOLTAGE/SEC.) COULD NOT BE MADE" : END
1370 ETCHTIME(PT)=ETCHTIME : VOLT(PT)=MEANVOLTAGE :PT=PT+1
1380 'PLOT DATA POINTS WHEN GENERATED, EXCEPT WHEN TAKING REFERENCE
1390 IF NEWREF=1 THEN 1430
1400 IF PT=1 THEN LINE (XSTART,YSTART) - (XSTART+XSTEP+XTRASTEP,YSTART-VOLT(PT-1
)*YSCALE),3 : GOTO 1430
1410 LINE -(XSTART+(PT-1)*XSTEP+XTRASTEP,YSTART-VOLT(PT-1)*YSCALE),3
1420 XTRASTEP=0   'RESET
1430 IF ETCHTIME=-1 AND TRACE =1 THEN 1440 ELSE 1460   'AFTER ETCH IS COMPLETE
1440 OFFFLAG=OFFFLAG+1   'OFF ONLY AFTER SECOND BELOW-THRESHOLD VALUE
1450 IF MEANVOLTAGE < THRESHOLD AND OFFFLAG=2 THEN TRACE=0 : OFFFLAG=0 : GOTO 14
70
1460 GOTO 860
1470 ' Eliminate ashing data, and reset conditions after real-time alarm
1480 COLOR 7,0,,0    'RESET AFTER REAL-TIME ALARM
1490 IF ETCHSTOP < 63 THEN 770    ' DO NOT MANIPULATE OR SAVE ASH DATA
1500 '***************CHECK ONE DATA POINT/SECOND**************************
1510 GOTO 1560          '<============ TEST PRINT BYPASS
1520 ' CHECK FOR DATA POINT AT EACH SECOND INTERVAL, CORRECT IF NECESSARY
1530 FOR I=0 TO PT-1
1540 PRINT I,ETCHTIME(I),VOLT(I)
1550 NEXT I
1560 '****************INTEGRATE DATA POINT-BY-POINT***********************
1570 N=PT-1 : SUM=0
1580 INTEGRAL(0)=0 : INTEGRAL(1)=.5*(VOLT(0)+VOLT(1))
1590 FOR I=2 TO N
1600 SUM=SUM + VOLT(I-1)
1610 INTEGRAL(I)=.5*(VOLT(0) + VOLT(I)) + SUM
1620 NEXT I
1630 GOTO 1670          '<============= TEST PRINT BYPASS
1640 FOR I=1 TO N
1650 PRINT I, VOLT(I), INTEGRAL(I)
1660 NEXT I
1670 IF NEWREF=1 THEN 1980   'BYPASS COMPARISONS FOR REFERENCE CUREVE
1680 '****************COMPARE WITH REFERENCE VALUES***********************
1690 FOR I=0 TO N
1700 DELTAVOLT(I)=VOLT(I)-REFVOLT(I)
1710 DELTAINTEGRAL(I)=INTEGRAL(I)-REFINTEGRAL(I)
```

```
1720 'PRINT USING "###.###";I, VOLT(I),DELTAVOLT(I),INTEGRAL(I),DELTAINTEGRAL(I)
1730 NEXT I
1740 '**************GENERATE NUMERIC VALUES IN EACH REGION******************
1750 ' PRINT TO SUMMARY DATA FILE (#2)
1760 PRINT "          FOR DATA FILE #: ";CURVE
1770 WRITE #2,STR$(CURVE)      'STRING FORMAT TAKES LESS SPACE. NEED TO HAVE <80 CH
ARACTERS
1780 ' REGION(1)
1790 I=1 : GOSUB 2370 : WRITE #2,STR$(PEAKVOLT)       ' MAXIMUM PEAK-HEIGHT
1800 I=1 : GOSUB 2470 : WRITE #2,STR$(FINTEG(REGION(I)))    ' INTEGRAL FUNCTION
1810 ' REGION(2)
1820 I=2 : GOSUB 2370 : WRITE #2,STR$(PEAKVOLT)       ' MAXIMUM PEAK-HEIGHT
1830 I=2 : GOSUB 2210 : WRITE #2,STR$(SLOPE),STR$(MIDPT)    ' SLOPE
1840 I=2 : GOSUB 2470 : WRITE #2,STR$(FINTEG(REGION(I)))    ' INTEGRAL FUNCTION
1850 GOTO 1940 ' REGION(3)
1860 I=3 : GOSUB 2210 : WRITE #2,STR$(SLOPE),STR$(MIDPT)    ' SLOPE
1870 I=3 : GOSUB 2470 : WRITE #2,STR$(FINTEG(REGION(I)))    ' INTEGRAL FUNCTION
1880 ' REGION(4)
1890 I=4 : GOSUB 2210 : WRITE #2,STR$(SLOPE),STR$(MIDPT)    ' SLOPE
1900 I=4 : GOSUB 2470 : WRITE #2,STR$(FINTEG(REGION(I)))    ' INTEGRAL FUNCTION
1910 ' REGION(5)
1920 I=5 : GOSUB 2210 : WRITE #2,STR$(SLOPE),STR$(MIDPT)    ' SLOPE
1930 I=5 : GOSUB 2470 : WRITE #2,STR$(FINTEG(REGION(I)))    ' INTEGRAL FUNCTION
1940 'MESSAGE TO SUMMARY FILE
1950 IF BADFLAG=1 THEN WRITE #2,"BAD" :GOTO 1980
1960 IF BADFLAG=2 THEN WRITE #2,"BURNT" : GOTO 1980
1970 WRITE #2,"    "
1980 ' *******************SAVE DATA FILE*********************************
1990 ' SAVE DATA IN A SEQUENTIAL FILE. THIS DATA HAS ALREADY BEEN MASSAGED TO:
2000 ' 1. Start at t=0, when the EP voltage exceeds a THRESHOLD value
2010 ' 2. There is one, and only one, data point at each 1 sec. interval
2020 ' 3. Data stops when the EP voltage drops below the THRESHOLD value
2030 IF NEWREF=1 THEN FILENAME$=DFILE$+".REF" : GOTO 2080   '.REF FILE FOR EACH D
ATA FILE
2040 IF BADFLAG = 0 THEN 2150       'save ONLY the BAD/BURNT data files
2050 CURV$=STR$(CURVE)
2060 CURVE$=RIGHT$(CURV$,LEN(CURV$)-1)   'DROP LEADING BLANK
2070 FILENAME$=DFILE$+CURVE$
2080 OPEN "O", #1, FILENAME$
2090 WRITE #1,DATE$,STARTTIME$
2100 FOR I=0 TO N
2110 WRITE #1,VOLT(I),INTEGRAL(I)
2120 NEXT I
2130 'WITH NO EXTRA PRINTING, INTEGRATION AND DATA STORAGE TAKES ~ 8 SEC
2140 CLOSE #1
2150 TRACE=0
2160 IF NEWREF=1 THEN NEWREF=0 :  GOTO 630 'ONLY AFTER GENERATING REFERENCE
2170 CURVE=CURVE+1 : ALARM=0    'ENABLE ALARM FOR NEXT SLICE
2180 IF BADFLAG>0 THEN K=K+1 :BADFLAG=0   'K IS BADSLICE(K) COUNTER
2190 GOTO 770
2200 '************DATA TREATMENT SUBROUTINES****************************
2210 ' LEAST SQUARE FIT TO A STRAIGHT LINE
2220 SXY=0 :SX=0 :SY=0 : SX2=0
2230 T1=STARTTIME(I) : T2=STOPTIME(I)  : N=T2-T1+1 :MEANTIME=(T1+T2)/2
2240 FOR I=T1 TO T2
2250 SXY=SXY+ETCHTIME(I)*VOLT(I)
2260 SX=SX+ETCHTIME(I)
2270 SY=SY+VOLT(I)
2280 SX2=SX2+ETCHTIME(I)^2
2290 NEXT I
2300 XSUM2=SX^2
2310 SLOPE=(N*SXY - SX*SY)/(N*SX2 - XSUM2)
2320 INTERCEPT=(SX2*SY - SX*SXY)/(N*SX2 - XSUM2)
2330 MIDPT=INTERCEPT + SLOPE*MEANTIME
2340 PRINT "BETWEEN ";T1;" AND ";T2; "SECONDS, THE SLOPE/MIDPOINT ARE: ";
2350 PRINT USING "##.####";SLOPE,MIDPT
2360 RETURN
2370 ' DETERMINE THE MAXIMUM VOLTAGE DURING A GIVEN TIME PERIOD
2380 T1=STARTTIME(I) : T2=STOPTIME(I) : PEAKVOLT=0
2390 FOR I=T1 TO T2
2400 IF VOLT(I) > PEAKVOLT   THEN PEAKVOLT=VOLT(I)
2410 NEXT I
2420 PRINT "BETWEEN ";T1;" AND ";T2; "SECONDS, THE PEAKVOLTAGE IS: ";
```

```
2430 PRINT USING "##.###";PEAKVOLT
2440 IF PEAKVOLT>HIPEAKLIM THEN BADSLICE(K)=CURVE : BADFLAG=1
2450 IF PEAKVOLT < LOPEAKLIM THEN BADSLICE(K)=CURVE : BADFLAG=1
2460 RETURN
2470 ' INTEGRAL FUNCTION
2480 FINTEG(REGION(I))=DELTAINTEGRAL(REGION(I))/REFINTEGRAL(REGION(I))*100
2490 PRINT "  INTEGRAL MISMATCH (%): ";
2500 PRINT USING "###.##";FINTEG(REGION(I))
2510 IF ABS(FINTEG(REGION(I))) > INTEGRLLIM THEN BADSLICE(K)=CURVE : BADFLAG=1
2520 RETURN
2530 ' SUSPEND LOOKING FOR EP SIGNAL. TILL KEY(8) IS ACTIVATED
2540 IF SUSPEND=0 THEN 2540
2550 SUSPEND=0                    'PREPARE FOR NEXT TIME
2560 RETURN
2570 ' RESUME LOOKING FOR EP SIGNAL
2580 SUSPEND=1
2590 RETURN
2600 ' STOP PROGRAM. CLOSE FILES
2610 CLOSE #1 : CLOSE #2
2620 PRINT "DATA FILES SAVED UNDER: "; DFILE$;"nn";"    LAST FILE # = ";CURVE-1
2630 PRINT "SUMMARY FILE IS: ";SFILE$
2640 PRINT "REFERENCE FILE IS: ";DFILE$;".REF"
2650 END
2660 RETURN
2670 '*********************PLOTTING SUBROUTINE***************************
2680 ' DRAW TIME AXIS AND REFERENCE CURVE
2690 CLS
2700 LINE (XSTART,YSTART) - (XSTART+XRANGE,YSTART),6
2710 LINE (XSTART+XRANGE/4,YSTART) - (XSTART+XRANGE/4,YSTART-5),6 'TIMING MARKS
2720 LINE (XSTART+XRANGE/2,YSTART) - (XSTART+XRANGE/2,YSTART-5),6
2730 LINE (XSTART+3*XRANGE/4,YSTART) - (XSTART+3*XRANGE/4,YSTART-5),6
2740 LINE (XSTART+XRANGE,YSTART) - (XSTART+XRANGE,YSTART-5),6
2750 FOR I=1 TO 4
2760 LOCATE 21,5 +I*17
2770 PRINT I*TIMERANGE/4
2780 NEXT I
2790 ' PLOT CURVE
2800 FOR I=0 TO REFPOINTS     'PLOT TO EP
2810 IF I=0 THEN LINE (XSTART,YSTART) - (XSTART+XSTEP,YSTART-REFVOLT(I)*YSCALE),
 2 : GOTO 2830
2820 LINE -(XSTART+I*XSTEP,YSTART-REFVOLT(I)*YSCALE),2
2830 NEXT I
2840 RETURN
2850 '>>>>>>>>>>>>>>>>>>>>>> IN-PROCESS PROBLEM INDICATOR <<<<<<<<<<<<<<<<<<<<
2855 GOTO 2910
2860 FOR II=1 TO 16
2870 READ A$
2880 A$="MB" + A$       ' PLAY IN BACKGROUND
2890 PLAY A$
2900 NEXT II
2910 COLOR 4,0,,64
2920 LOCATE 18,20 : PRINT "PROBLEM NOW !!!!"
2925 SLICEBURN=0 : ALARM=1 :RETURN
2930 DATA O2, T220, L2, A., A, A4, A., O3, C, O2, B4, B2, A4, A2, G#3, A.
2940 RETURN
```

Although the preferred embodiment has been described in detail, it should be understood that various changes, substitutions and alterations can be made therein without departing from the spirit and scope of the invention as defined by the appended claims.

For example, an additional characteristic of acquired data that can be compared to the reference end-point trace is the deviation of the end-point trace in a region from a straight line.

What is claimed is:

1. A method of obtaining process operation information from a plasma reactor, said reactor being capable of effecting a reaction with at least a particular material from a slice, which slice includes said particular material and on which semiconductor components are being at least partially formed, there being a sensor associated with said reactor and capable of producing an electrical signal having a varying amplitude proportional to the varying intensity of a reaction of said particular material in said reactor as said reaction progresses with time, a start and an end of said reaction each being indicated by said electrical signal passing through a threshold amplitude and varying intensities of said reaction between said start and end being indicated by varying amplitudes of said electrical signal different from said threshold amplitude, said method comprising:

A. selecting a series of reference varying amplitudes to define a reference continuously variable signal curve indicative of observed intensities of a desired reaction of said particular material in said plasma reactor from at least said start to at least said end;

B. conducting an actual reaction of said particular material in said plasma reactor from at least said start to at least said end;

C. acquiring actual varying amplitudes of said electrical signal, which forms an actual continuously variable signal curve, between said start and end during said conducting said reaction;

D. comparing said reference varying amplitudes and said actual varying amplitudes; and E. generating an indicator signal upon said reference and actual amplitudes differing from one another by a particular amount to indicate an aberration in said actual reaction compared to said desired reaction.

2. The method of claim 1, further including:
dividing said reference curve into a plurality of regions;
dividing the actual curve into a plurality of regions; and
comparing characteristics of at least one region of the actual curve with corresponding characteristics of a corresponding region of the reference curve.

3. The method of claim 2, wherein the actual curve is divided into a plurality of regions as a function of time from the start of the etch as indicated by the actual curve.

4. The method of claim 2, further including:
generating a predetermined signal if the comparison of characteristics of at least one region of the actual curve with the characteristics of a corresponding region of the reference curve indicate a deviation between such characteristics that exceeds a predetermined value.

5. The method of claim 2, wherein the characteristics of one region of the actual curve which are compared with the characteristics of a corresponding region of the reference curve include at least one of:
the slope of the curve in the region;
the amplitude of the curve in the region;
the deviation of the curve in the region from a straight line;
the integral of the area of the region; and
the sum of the squares of deviation from the reference curve in the region.

6. The method of claim 2, further including:
determining whether a deviation between a characteristic of the actual trace and a corresponding characteristic of the reference trace exceeds predefined values;
attributing such deviation to at least one predefined cause; and
generating a cause signal identifying said at least one predefined cause to which the deviation has been attributed.

7. The method of claim 2, wherein the actual curve of the plasma etch reactor is acquired by monitoring a reaction species of the etch operation.

8. The method of claim 7, wherein said reaction species monitored by the end-point trace is carbon monoxide.

9. A method of monitoring operations in process equipment which carries out a predetermined etched plasma process, which process is first monitored by detector apparatus that provides an actual continuously variable signal curve corresponding to the progress of the process, and wherein the reference continuously variable signal curve can be defined, which reference continuously variable signal curve corresponds to a predefined acceptable operation of the predetermined process, the method comprising:
defining a reference continuously variable signal curve for the predetermined process;
defining a plurality of regions in said reference continuously variable signal curve;
defining characteristics for at least one region of said reference continuously variable signal curve;
conducting said predetermined process;
acquiring from the detector apparatus an actual continuously variable signal curve corresponding to the progress of the process conducted from a start to and end of the process;
dividing the actual continuously variable signal curve acquired into regions;
comparing characteristics of at least one of the regions of the actual continuously variable signal curve with the characteristics of a corresponding region in the reference continuously variable signal curve; and
generating an indicator signal if a characteristic of one of the regions of the actual continuously variable signal curve exceeds by a predetermined limit a corresponding characteristic of a region of the reference continuously variable signal curve.

10. The method of claim 9, further including:
attributing at least one predefined cause to a deviation between a characteristic of the actual continuously variable signal curve and a corresponding characteristic of the reference continually variable signal curve exceeding a predefined value; and
generating a cause signal identifying said at least one predefined cause to which the deviation has been attributed.

11. The method of claim 9, wherein said continuously variable signal curve is generated by a continuously variable signal of voltage which varies with time.

12. The method of claim 11, wherein the beginning of said predetermined process is signified approximately when the voltage of said continuously variable signal crosses a predefined threshold value.

13. The method of claim 9, wherein the predetermined process includes a plasma etch process.

14. The process of claim 13, wherein the reference continuously variable signal curve includes a reference trace curve for the plasma etch process and the actual continuously variable signal curve includes an actual trace for the plasma etch process.

15. The method of detecting aberrations in semiconductor manufacturing operations, comprising:
defining a reference trace for a predetermined etch process;
defining regions in the reference trace;
defining characteristics for at least one region of the reference trace;
conducting the predetermined etch process on a semiconductor device;
acquiring an actual trace for the etch of the semiconductor device from a start to an end of the operation;
dividing the actual trace into regions corresponding to the predefined regions of the reference trace;
comparing characteristics of at least one region of the actual trace with corresponding characteristics of the corresponding region of the reference trace; and
generating an indicator signal if characteristics of the at least one region of the actual trace vary beyond predefined limits corresponding characteristics of the corresponding region of the reference trace.

16. The method of claim 15, wherein the actual end-point trace is sampled at predetermined intervals during the etch process.

17. The method of claim 15, wherein the reference end-point trace is divided into at least three regions.

18. The method of claim 15, wherein there corresponds a region in the reference end-point trace for at least one layer of material to be etched from the semiconductor device.

19. The method of claim 15, wherein the characteristics of one region of the reference end-point trace which are compared with the characteristics of the corresponding region of the actual end-point trace include at least one of:
the slope of the end-point trace in the region;
the amplitude of the end-point trace in the region;
the deviation of the end-point trace in the region from a straight line;
the integral of the area of the region; and
the sum of the squares of deviation from the reference curve in the region.

20. The method of claim 15, further including:
determining whether a deviation between at least one characteristic of the actual trace and at least one corresponding characteristic of the reference trace exceeds a predefined value for each characteristic;
attributing such deviation to at least one, predefined cause; and
generating a cause signal identifying said at least one predefined cause to which the deviation has been attributed.

21. The method of claim 15, wherein the regions of the reference end-point trace are defined as a function of time from the initiation of the etch process.

22. The method of claim 21, wherein said step of dividing the actual end-point trace into regions corresponding to the predefined regions of the reference end-point trace is conducted by dividing the actual end-point trace into regions as a function of time.

23. A method of detecting aberrations in a plasma process of semiconductor manufacturing operations, comprising:
defining a reference trace for said plasma process;
conducting the plasma process on a semiconductor device;
acquiring an actual trace for the process of the semiconductor device from a start to and end;
dividing the reference trace into predefined regions;
dividing the actual trace into regions corresponding to the predefined regions of the reference trace;
comparing characteristics of regions of the actual trace with corresponding characteristics of corresponding regions of the reference trace; and
generating an indicator signal if characteristics of the regions of the actual trace vary beyond predefined limits from corresponding characteristics of corresponding regions of the reference trace.

24. The method of claim 23, wherein said step of dividing the actual trace into regions includes dividing the actual trace into regions with at least a portion of the start and end of the regions being determined as a function of time from a defined start of the actual trace.

25. The method of claim 24, wherein said defined beginning of the actual trace includes a point in time when the actual trace exceeds a predetermined threshold value.

26. A method of obtaining process operation information form a plasma reactor, said reactor being capable of effecting a reaction with at least a particular material from a slice, which slice includes said particular material and on which semiconductor components are being at lease partially formed, there being a sensor associated with said reactor and capable of producing an electrical signal having a varying amplitude proportional to the varying intensities of a reaction of said particular material in said reactor as said reaction progresses with time, a start and an end of said reaction each being indicated by said electrical signal of a threshold amplitude and varying intensities of said reaction between said start and end being indicated by varying amplitudes of said electrical signal different from said threshold amplitude, said method comprising:
A. selecting a series of reference varying amplitudes to define a reference continuously variable signal curve indicative of intensities of at least a certain reaction specie of a desired reaction of said particular material in said plasma reactor from at least said start to at least said end;
B. conducting an actual reaction of said particular material to produce time varying quantities of said certain reaction specie in said plasma reactor from the start of said reaction through the end of said reaction;
C. acquiring actual varying amplitudes of said electrical signal to form an actual continuously variable signal curve indicating the time varying quantities of said certain reaction specie between said start and end during said conducting said reaction;
D. dividing each of said reference and actual curves into at least one region between said start and end;
E. defining at least the same one characteristic for each of said at least one regions of each of said reference and actual curves;
F. comparing said at least one same characteristic of said at least one regions of said reference and actual curves with one another; and
G. generating an indicator signal indicating the results of the comparison of said at least one same characteristic of said at least one regions of said reference and actual curves with one another.

27. A method of obtaining process information during production of semiconductor devices by a plasma reaction comprising:
A. conducting said reaction from at least a start to at least an end;
B. acquiring actual continuous data from said reaction that corresponds to the observed progress of said reaction from said start to said end; and
C. comparing said actual continuous data to reference continuous data to obtain said information.

28. The method of claim 27 in which said conducting includes conducting an etch reaction, and said acquiring actual data includes monitoring a reaction specie of said etch reaction.

29. The method of claim 27 including generating a predetermined signal upon said comparing indicating a deviation between said reference and actual data that exceeds a predetermined value.

30. The method of claim 27 in which said acquiring includes sampling said actual data at predetermine intervals during the etch process.

31. The method of claim 27 in which said comparing includes:
- A. determining whether a deviation between said reference and actual data exceeds a predefined value;
- B. attributing at least one cause to said deviation; and
- C. generating a cause signal identifying said at least one cause to which said deviation has been attributed.

32. The method of claim 27 in which said acquiring actual data includes generating an actual data signal of voltage that varies in amplitude with time according to observed intensities of said reaction.

33. The method of claim 32 including defining said start approximately when said actual data signal voltage crosses a predetermined threshold value.

34. The method of claim 27 including:
- A. dividing the reference data into plural regions;
- B. dividing the actual data into plural regions; and
- C. comparing characteristics of at least one region of the actual data with corresponding characteristics of a corresponding region of the reference data.

35. The method of claim 34 in which said monitoring includes monitoring a reaction specie of carbon monoxide.

36. The method of claim 34 including dividing said actual data into plural regions as a function of time from the start of said reaction.

37. The method of claim 34 in which said comparing characteristics includes comparing at least one of:
- A. the slope of the data in a region;
- B. the amplitude of the data in a region;
- C. the deviation of the data in the region from a straight line;
- D. the integral of the area of the region; and
- E. the sum of the squares of deviation from the reference curve in the region.

38. The method of claim 34 in which said dividing the reference data includes dividing the reference data into plural regions as a function of time from the initiation of said reaction.

39. The method of claim 34 in which said dividing the reference data includes dividing the reference data into at least three regions.

40. The method of claim 34 in which said dividing the reference data includes dividing the reference data into a region for at least one layer of material to be etched from the semiconductor device.

41. The method of claim 34 in which said dividing said actual data into plural regions includes determining at least a portion of a start and end of said regions as a function of time from said start.

* * * * *